United States Patent [19]

Suenaga

[11] 4,359,694
[45] Nov. 16, 1982

[54] FM DEMODULATOR FOR A PLURALITY OF CARRIER FREQUENCIES

[75] Inventor: Kazuyuki Suenaga, Noda, Japan

[73] Assignee: Victor Company of Japan, Ltd., Yokohama, Japan

[21] Appl. No.: 156,858

[22] Filed: Jun. 4, 1980

[30] Foreign Application Priority Data

Jun. 5, 1979 [JP] Japan .................................. 54-69467

[51] Int. Cl.³ .............................................. H03D 3/26
[52] U.S. Cl. ..................................... 329/103; 329/142; 329/143; 358/23; 455/214
[58] Field of Search ............... 329/103, 140, 142, 143; 455/214, 337; 358/23, 24

[56] References Cited

U.S. PATENT DOCUMENTS 3,024,421  3/1962  Clark ................................... 329/143
3,800,226  3/1974  Close ............................... 455/214 X
4,160,955  7/1979  Sato ................................. 455/214 X

FOREIGN PATENT DOCUMENTS 2910245  10/1979  Fed. Rep. of Germany ...... 329/103

Primary Examiner—Siegfried H. Grimm
Attorney, Agent, or Firm—Michael N. Meller; Anthony H. Handal

[57] ABSTRACT

An FM signal demodulating circuit comprises a peak differential type amplifier having two input terminals, a resonance circuit network connected between the two input terminals of the peak differential type amplifier, and a capacitor between the resonance circuit network and the ground. The resonance circuit network comprises a plurality of parallel resonance circuits which are connected in series and have respectively different parallel resonance frequencies. The demodulating circuit has a demodulating characteristic curve for demodulating FM signals having different carrier frequencies.

4 Claims, 4 Drawing Figures

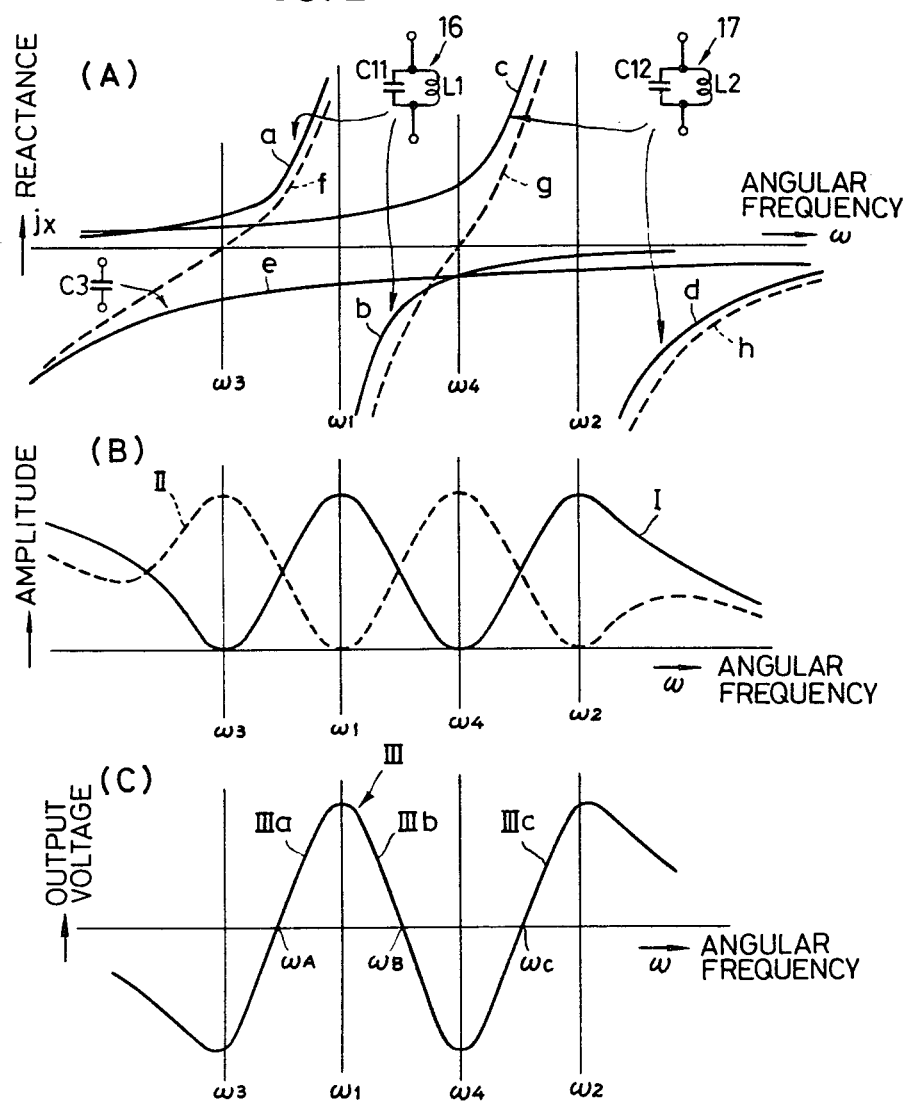

FM DEMODULATOR FOR A PLURALITY OF CARRIER FREQUENCIES

BACKGROUND OF THE INVENTION

The present invention relates to FM signal demodulating circuits, and more particularly to an FM signal demodulating circuit of peak differential type which has a demodulating characteristic curve extending over a plurality of frequency bands and demodulates a plurality of FM signals.

As one type of circuit for demodulating a signal in which a carrier is frequency modulated by a modulating signal (such a signal being referred to as an FM signal in the present specification and appended claims), there have been heretofore known FM signal demodulating circuits of peak differential type. Further, there has been known an FM signal demodulating circuit which employs an FM signal demodulating circuit of peak differential type and has a circuit construction for selectively demodulating one of a plurality of FM signals having different carrier frequencies, as described hereinbelow.

In this conventional FM signal demodulating circuit, a circuit consisting of a first capacitor and a first switch connected in series and another circuit consisting of a second capacitor and a second switch connected in series are connected in parallel between two input terminals of a peak differential type amplifier. A circuit consisting of a third capacitor and a coil connected in parallel is further connected in parallel with these series connection circuits. A fourth capacitor is connected between one of the input terminals of the amplifier and the ground.

In this conventional FM signal demodulating circuit, parallel-connection of the first and second capacitors with the third capacitor and coil is made and broken by opening and closing of the first and second switches, whereby the value of the capacitance connected in parallel with the coil is changed.

Accordingly, when the first and second switches are opened, the demodulating circuit demodulates an FM signal having a carrier of a frequency corresponding to a high parallel resonance frequency determined by the capacitance of the third capacitor and the inductance of the coil. When the first and second switches are closed, the demodulating circuit demodulates an FM signal having a carrier of a frequency corresponding to a low parallel resonance frequency determined by the capacitances of the first, second and third capacitors and the inductance of the coil. When either one of the first and second switches is opened and the other one is closed, either one of the first and second capacitors is connected in parallel with the third capacitor and coil, whereby the demodulating circuit demodulates an FM signal having a carrier of a frequency corresponding to a parallel resonance frequency of the parallel connection circuit. As described above, the demodulating circuit selectively demodulates one FM signal out of four FM signals respectively having different carrier frequencies responsive to the combination in which the first and second switches are opened and/or closed.

In television systems, the frequency difference between the video carrier frequency and the audio sub-carrier frequency is 4.5 MHz in NTSC system, 5.5 MHz in CCIR system, 6 MHz in PAL-I system, and 6.5 MHz in SECAM-OIRT system. Frequencies of the color sub-carriers in the respective color television systems are approximately the same as are the band widths of video signals therein.

In this connection, when this conventional FM signal demodulating circuit is employed in a dual-system television receiver which is capable of selectively receiving television signals of different systems, it is sufficient to provide only one such demodulating circuit for the FM audio signals so that the circuit construction of the demodulating circuit system in the television receiver is simplified.

However, since this conventional FM signal demodulating circuit employs a plurality of switching elements, it has disadvantages in that troublesome manufacturing operations are required for mounting the switches on the cabinet of the television receiver and that the number of circuit elements is increased, whereby the manufacturing costs are increased. Further, it is troublesome for the viewer to switch the switching elements manually. Moreover, the slope or gradient of the demodulating characteristic curve of the S-figure is changed in response to making and breaking of the parallel connection of the first and second capacitors with the parallel connection circuit of the third capacitor and coil responsive to switching of the switches, whereby the demodulated output level is accordingly changed. There has been a further disadvantage that, since only the capacitance value is changed, linearity of the slope of the S-figure demodulating characteristic curve is poor giving rise to demodulation distortion.

SUMMARY OF THE INVENTION

Accordingly, it is a general object of the present invention to provide a new and useful FM signal demodulating circuit in which the above described disadvantages are eliminated.

Another and specific object of the invention is to provide an FM signal demodulating circuit which has a demodulating characteristic curve consisting of a plurality of demodulating characteristic curve parts for a plurality of frequency bands of FM signals and being capable of demodulating those FM signals. Use of the demodulating circuit of the invention makes switching elements such as those required in the conventional circuit unnecessary, thus eliminating another of the disadvantages of the conventional circuit.

Other objects and further features of the invention will be apparent from the following detailed description with respect to preferred embodiments of the invention when read in conjunction with the accompanying drawings.

BRIEF DESCRIPTION OF THE INVENTION

FIG. 1 is a circuit diagram of a first embodiment of an FM signal demodulating circuit of the present invention;

FIG. 2 in parts (A), (B), and (C) provides graphs respectively showing the frequency characteristic curve, the frequency-versus-amplitude characteristic curve, and the frequency-versus-output voltage characteristic curve of an essential part of the circuit shown in FIG. 1;

FIG. 3 is a circuit diagram of a second embodiment of the FM signal demodulating circuit of the invention; and FIG. 4 is a schematic circuit diagram of a modification of the circuit of the first embodiment shown in FIG. 1.

DETAILED DESCRIPTION

Figure 1:
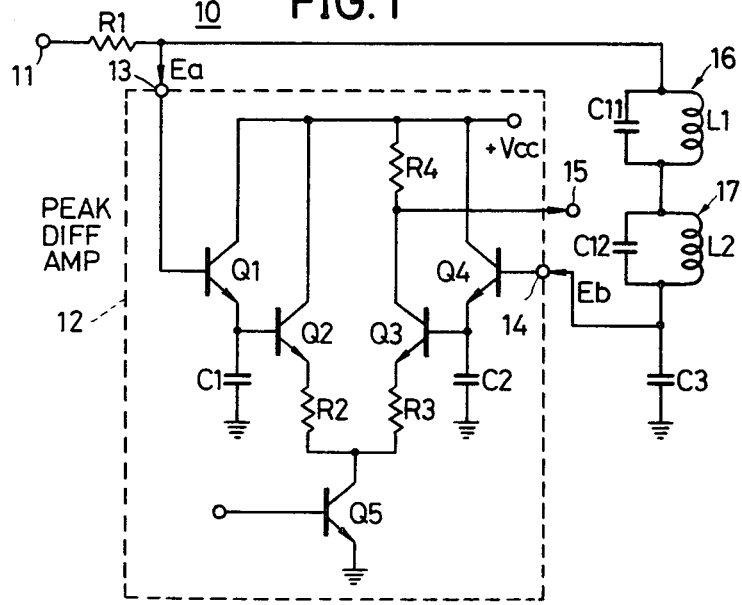

In an FM signal demodulating circuit 10 shown in FIG. 1, an input FM signal which has been amplitude-limited is applied to an input terminal 11. The input FM signal is applied, through a resistor R1, to an input terminal 13 of a peak differential type amplifier 12, and to one end of a first parallel connection resonance circuit (hereinafter referred to as a first resonance circuit) 16 consisting of a capacitor C11 and a coil L1 connected in parallel.

The peak differential type amplifier 12 has a well-known circuit construction which comprises NPN transistors Q1 and Q4, NPN transistors Q2, Q3, and Q5 constituting an unbalanced differential amplifier, resistors R2, R3, and R4, and capacitors C1 and C2. The input FM signal having voltage Ea is applied to the base of the transistor Q1 from the input terminal 13.

A second parallel connection resonance circuit (hereinafter referred to as a second resonance circuit) 17 consisting of a capacitor C12 and a coil L2 connected in parallel is connected in series with the first resonance circuit 16. A capacitor C3 is connected between the second resonance circuit 17 and ground. Voltage Eb appearing across the capacitor C3 is applied to the base electrode of the transistor Q4 through an input terminal 14 of the peak differential type amplifier 12.

The position peak of the voltage Ea is held by the transistor Q1 and capacitor C1 and thereafter applied to the base of the transistor Q2. Similarly, the positive peak of the voltage Eb is held by the transistor Q4 and capacitor C2 and thereafter applied to the base of the transistor Q3. As a result, an output differential voltage Vo proportional to the difference between the voltages whose positive peaks have been held is derived as a demodulated output voltage through an output terminal 15 from the collector of the transistor Q3. Here, the output voltage Vo is represented by the following equation.

$$Vo = K(|Ea| - |Eb|) \quad (1)$$

where K is a constant.

Next, the frequency characteristics of the first and second resonance circuits 16 and 17 connected in series between the terminals 13 and 14 are described in conjunction with FIG. 2(A). In FIG. 2(A), the angular frequency $\omega$ ($2\pi f$, f denoting frequency) is represented on the abscissa and the reactance on the ordinate. In this figure, curves a and b show the frequency characteristics of the first resonance circuit 16, curves c and d show the frequency characteristics of the second resonance circuit 17, and a curve e shows the frequency characteristic of the capacitor C3. Broken-line curves f, g, and h show the frequency characteristics of a total reactance circuit network consisting of the first and second resonance circuits 16 and 17, and the capacitor C3 connected in series. Angular frequencies $\omega 1$ and $\omega 2$ denote parallel resonance angular frequencies, while angular frequencies $\omega 3$ and $\omega 4$ denote series resonance angular frequencies.

The voltage $|Ea|$ applied to the input terminal 13 has its maximum value at the parallel resonance angular frequencies $\omega 1$ and $\omega 2$ and its minimum value at the series resonance angular frequencies $\omega 3$ and $\omega 4$. On the other hand, the voltage $|Eb|$ applied to the input terminal 14 has its maximum value at the series resonance angular frequencies $\omega 3$ and $\omega 4$ and its minimum value at the parallel resonance angular frequencies $\omega 1$ and $\omega 2$. Accordingly, characteristics of the voltage $|Ea|$ and $|Eb|$ for the angular frequency are shown by broken-line curve I and solid-line curve II in FIG. 2(B).

These voltages $|Ea|$ and $|Eb|$ are subjected to signal processing as shown by Eq. (1) in the peak differential type amplifier 12, whereby the demodulated output voltage Vo which is proportional to the value $(|Ea| - |Eb|)$ is derived from the output terminal 15. The demodulated output voltage Vo has a characteristic curve III consisting of three characteristic curve parts IIIa, IIIb, and IIIc of the S-figure which are continuously connected in one curved line. As shown by the characteristic curve III, the output voltage has its minimum value at the angular frequencies $\omega 3$ and $\omega 4$ and its maximum value at the angular frequencies $\omega 1$ and $\omega 2$. The angular frequencies $\omega 1$, $\omega 2$, $\omega 3$, and $\omega 4$ are respectively represented by the following equations.

$$\omega 1 = \frac{1}{\sqrt{L1\,C11}} \quad (2)$$

$$\omega 2 = \frac{1}{\sqrt{L2\,C12}} \quad (3)$$

$$\omega 3 = \sqrt{\frac{L1(C11 + C3) + L2(C12 + C3) - \sqrt{\{L1(C11 + C3) - L2(C12 + C3)\}^2 + 4L1L2C3^2}}{2L1L2(C12C3 + C11C3 + C11C12)}} \quad (4)$$

$$\omega 4 = \sqrt{\frac{L1(C11 + C3) + L2(C12 + C3) + \sqrt{\{L1(C11 + C3) - L2(C12 + C3)\}^2 + 4L1L2C3^2}}{2L1L2(C12C3 + C11C3 + C11C12)}} \quad (5)$$

Angular frequencies at the crossing points of the curve III and the abscissa, namely, the center angular frequencies of the curve parts IIIa, IIIb, and IIIc are represented by $\omega A$, $\omega B$, and $\omega C$. In a case where the carrier frequency of the FM signal applied to the input terminal 11 is the same as any one of the frequencies $$fA\left(=\frac{\omega A}{2\pi}\right), fB\left(=\frac{\omega B}{2\pi}\right), \text{and } fC\left(=\frac{\omega C}{2\pi}\right),$$

this input FM signal is demodulated by the demodulating circuit 10. Accordingly, when an FM signal having a carrier of any one of the frequencies fA, fB, and fC is applied to the input terminal 11, this input FM signal is demodulated by the same demodulating circuit 10 without need for any manual operation for switching over the switch elements as in the conventional circuit.

The FM signal demodulating circuit of the present invention has advantages in that no switching elements for selectively switching the bands of FM signals to be demodulated are required, that the number of circuit components is decreased, that the circuit construction is simple, and that manufacturing cost is low. Moreover, troublesome manual operations are not required. Still further, in the FM signal demodulating circuit of the present invention, neither the slope of the demodulating characteristic curve nor the demodulated output level is changed, as happens with the changeover of the switches in the conventional circuit. Furthermore, the slope of the frequency characteristic curve of the output voltage is excellent in linearity, whereby hardly any demodulation distortion is produced due to non-linearity of the slope of the characteristic curve.

In FIG. 2(C), the curve III consists of the curve parts IIIa, IIIb, and IIIc. The S-figure characteristic curve IIIb which has the center angular frequency $\omega B$ is opposite in polarity to the S-figure characteristic curves IIIa and IIIc which have the center frequencies $\omega A$ and $\omega C$, respectively. Accordingly, the slope or gradient of the curve IIIb is opposite to those of the curves IIIa and IIIc, whereby the output demodulated by utilization of the curve IIIb is opposite in polarity to the outputs demodulated by utilization of the curves IIIa and IIIc. However, this opposite polarity does not affect the demodulation of FM audio signal.

Figure 3:
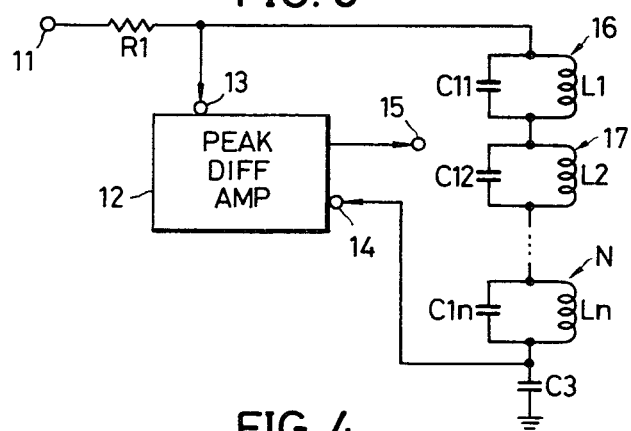

A second embodiment of the demodulating circuit of the present invention will now be described in conjunction with FIG. 3. In FIG. 3, those parts which are the same as corresponding parts in FIG. 1 are designated by like reference numerals. Description of such parts will not be repeated.

In the present embodiment, one or more parallel connection resonance circuits consisting of capacitors and coils are connected in series with the parallel resonance circuits 16 and 17. A total of n (n being an integer equal to 3 or more) parallel connection resonance circuits which have respectively different center angular frequencies are connected in series between the terminals 13 and 14. In this case, the demodulating circuit has a demodulating characteristic curve consisting of (2n−1) S-figure characteristic curve parts continuous with each other.

Figure 4:
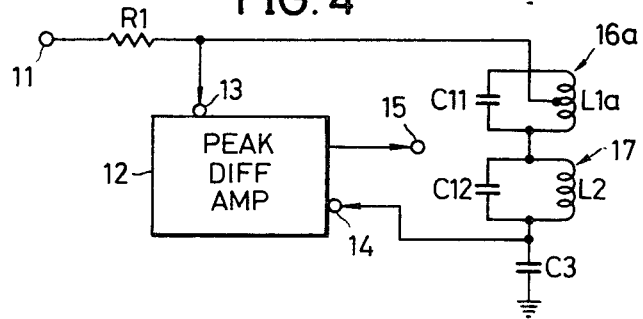

A modification of the demodulating circuit of the first embodiment of FIG. 1 will now be described in conjunction with FIG. 4. In FIG. 4, those parts which are the same as corresponding parts in FIG. 1 are designated by like reference numerals. Description of such parts will not be repeated. A first parallel resonance circuit 16a connected in series with the second parallel resonance circuit 17 consists of the capacitor C11 and a coil L1a having a center tap connected in parallel. The terminal 13 is connected to the center tap of the coil L1a. In this modification, the quality factor Q of the resonance circuit 16a is greater than that of the resonance circuit 16 of the first embodiment.

An example of the constants of the circuit elements in this modification is as follows.

| Capacitors | | Coils | |
| --- | --- | --- | --- |
| C1 | 68 PF | L1 | 11 μH |
| C2 | 39 PF | L2 | 10 μH |

The center angular frequencies $\omega A$, $\omega B$, and $\omega C$ of the characteristic curves IIIa, IIIb, and IIIc are represented as follows.

$\omega A = 2\pi fA$, $\omega B = 2\pi fB$, $\omega C = 2\pi fC$ An example of frequencies fA, fB, and fC is as follows.

fA = 5.5 MHz, fB = 6 MHz, fC = 6.5 MHz

The demodulating circuit according to the present invention has more advantageous features in a case where it is employed as an audio signal demodulating circuit in the dual system television receiver described hereinbefore. However, it is not limited to employment as an audio signal demodulating circuit.

In the illustrations in the drawings and in descriptions of the embodiments and the modification, each of the parallel resonance circuits is represented as a reactance circuit network consisting of pure capacitance and inductance. However, in actual cases, the parallel resonance circuit consists of an impedance circuit network, since the resistances of the capacitor and coil are not negligible.

Further, this invention is not limited to these embodiments but various variations and modifications may be made without departing from the scope of the invention.

What I claim is:

1. An FM signal demodulating circuit for demodulating any one of a plurality of input signals having given different carrier frequencies, comprising:
    (a) a differential amplifier having two input terminals;
    (b) means for coupling of said FM signals to one of said input terminals of said differential amplifier;
    (c) a resonant circuit network connected between said two input terminals, of said differential amplifier, said resonant circuit network comprising a plurality of parallel resonant circuits which are connected in series, said parallel resonant circuits having different parallel resonance frequencies; and
    (d) a capacitor connected between the other input terminal of said differential amplifier and a reference potential, said plurality of parallel resonant circuits and said capacitor forming a series resonant circuit, said series resonant circuit having a plurality of series resonance frequencies, said series and parallel resonance frequencies having values selected to result in each of said FM signals having given carrier frequencies lying substantially in the middle between that one of said series resonance frequencies which is nearest to its respective carrier frequency and that one of said parallel resonance frequencies which is nearest to its respective carrier frequency.

2. An FM signal demodulating circuit as claimed in claim 1, in which said resonant circuit network comprises n (n being an integer equal to two or more) parallel resonant circuits which are connected in series and have respectively different parallel resonance frequencies, so that the FM signal demodulating circuit has a demodulating characteristic curve comprising (2n−1) S-figure demodulating characteristic curve parts which are contiguously connected in sequence in such a manner that the polarities of the S-figures of the demodulating characteristic curve parts are opposite to each other in sequence, whereby any one of (2n−1) FM signals may be selectively demodulated.

3. An FM signal demodulating circuit as claimed in claim 1 or 2, which is employed as an FM audio signal demodulating circuit in a versatile television receiver capable of selectively receiving the television signals of any one of a plurality of different systems.

4. An FM signal demodulating circuit as claimed in claim 1 or 2, wherein said series resonance frequencies and said parallel resonance frequencies are selected to be disposed in alternate fashion in the spectrum and each of said given carrier frequencies lies between adjacent ones of said parallel resonance frequencies and said series resonance frequencies.

* * * * *